(12) United States Patent
Nakahata et al.

(10) Patent No.: US 8,134,223 B2
(45) Date of Patent: Mar. 13, 2012

(54) III-V COMPOUND CRYSTAL AND SEMICONDUCTOR ELECTRONIC CIRCUIT ELEMENT

(75) Inventors: Seiji Nakahata, Itami (JP); Koji Uematsu, Itami (JP); Ryu Hirota, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 298 days.

(21) Appl. No.: 12/617,733

(22) Filed: Nov. 13, 2009

(65) Prior Publication Data
US 2010/0090313 A1 Apr. 15, 2010

Related U.S. Application Data

(60) Continuation-in-part of application No. 12/188,214, filed on Aug. 8, 2008, now abandoned, which is a continuation of application No. 11/871,162, filed on Oct. 12, 2007, now Pat. No. 7,485,484, which is a division of application No. 10/521,060, filed as application No. PCT/JP2004/004811 on Apr. 1, 2004, now Pat. No. 7,297,625.

(30) Foreign Application Priority Data

May 8, 2003 (JP) .................................. 2003-129829

(51) Int. Cl.
*H01L 21/00* (2006.01)
(52) U.S. Cl. .................... 257/615; 257/E33.023; 438/42
(58) Field of Classification Search .................. 257/615, 257/E33.023; 438/42, 602
See application file for complete search history.

(56) References Cited

U.S. PATENT DOCUMENTS

| 5,569,954 A  | * | 10/1996 | Hata et al. ...................... 257/627 |
| 6,225,650 B1 | * | 5/2001  | Tadatomo et al. ............. 257/190 |
| 6,413,627 B1 | * | 7/2002  | Motoki et al. ................. 428/332 |
| 6,420,198 B1 | * | 7/2002  | Kimura et al. .................. 438/22 |

* cited by examiner

*Primary Examiner* — Thao P. Le
(74) *Attorney, Agent, or Firm* — James W. Judge

(57) ABSTRACT

Favorable-quality III-V crystals are easily obtained at low cost without causing cracks, even when using a variety of substrates, and can be used to manufacture semiconductor devices with good quality and at high yields. The III-V crystals are characterized by the following properties: the carrier concentration, resistivity, and dislocation density of the III-V compound crystal are uniform to within ±30% variation along the surface; the III-V compound crystal is misoriented from the c-plane such that the crystal surface does not include any region where its off-axis angle with the c-plane is 0°; and the full width at half-maximum in XRD at the crystal center of the III-V compound is not greater than 150 arcsec.

4 Claims, 6 Drawing Sheets

III-V COMPOUND CRYSTAL AND SEMICONDUCTOR ELECTRONIC CIRCUIT ELEMENT

BACKGROUND OF THE INVENTION

1. Technical Field

The present invention relates to crystals of Group III-V compounds and to methods of their manufacture, and more particularly relates to methods of manufacturing good-quality Group III-V compound crystal without producing cracks, even with the use of a variety of substrates, and to semiconductor devices manufactured employing the crack-free Group III-V compound crystal.

2. Description of the Related Art

Growing a crystal of a Group III-V compound, such as GaN crystal, on a substrate of a different material from the crystal material, such as a sapphire substrate or a silicon (Si) substrate, causes stress between the crystal and the substrate due to differences in properties such as their crystal lattice constants and thermal expansion coefficients, leading to warps and cracks; thus, the process does not yield Group III-V crystals of good quality.

In view of this problem, a method has been carried out for alleviating the stress between the crystals and the substrate by depositing a film of a silicon oxide (such as $SiO_2$) on a sapphire substrate; patterning the silicon oxide film is by a technique such as photolithography, and thereafter growing a Group III-V crystal onto the patterned substrate. Such a method, however, is problematic in that it requires the patterning of the silicon oxide film, which means the manufacturing cost is high.

Another technique that has been proposed is one in which a GaN layer is grown on a substrate such as sapphire by a metal organic chemical vapor deposition (MOCVD) technique, followed by the depositing of a metal film thereon and performance of a heat treatment to form voids in the GaN layer; thereafter, a GaN crystal is grown. (See Japanese Unexamined Pat. App. Pub. No. 2002-343728, for example.) Nevertheless, a problem arises with such a method because growing a GaN layer by MOCVD leads to extremely high manufacturing costs.

Still another technique that has been proposed is one in which a metal film is deposited on a sapphire or like substrate and thereafter a GaN crystal is grown. (See Japanese Unexamined Pat. App. Pub. Nos. 2002-284600, for example.) Such a method, however, is problematic in that the qualities of the resulting GaN crystal are compromised because the GaN crystal is grown on a metal film that has a different lattice constant from that of the GaN crystal.

BRIEF SUMMARY OF THE INVENTION

An object of the present invention, in order to resolve the problems discussed above, is to make available good-quality, large-diameter Group III-V compound crystal that is obtained by a simple, low-cost manufacturing method, methods of manufacturing such crystal, and semiconductor devices manufactured utilizing the Group III-V compound crystal.

A Group III-V compound crystal structure according to the present invention comprises a substrate; a metal film patterned with holes or grooves having an average width of 2 nm to 5000 nm, at an aperture fraction of 5% to 80% with respect to the substrate total surface area; and III-V compound grown on the metal film. The III-V crystal in the structure may be a GaAlInN composition. The substrate may be composed of silicon, sapphire, SiC, $ZrB_2$, or a Group III-V compound, and the metal film may be deposited on the substrate and contain at least titanium or vanadium. A III-V compound crystal structure of the present invention can exhibit a full width at half-maximum (FWHM), by X-ray diffraction (XRD), of 150 arcsec or less.

DETAILED DESCRIPTION OF THE INVENTION

Embodiment 1

Figure 1A:
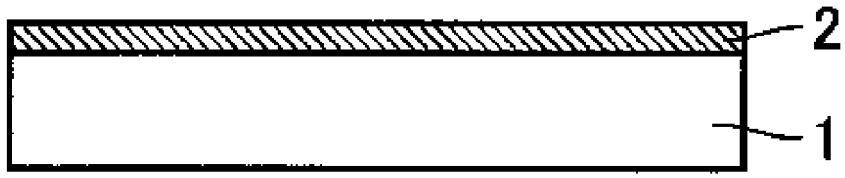
FIG. 1 illustrates one method of manufacturing a Group III-V crystal according to the present invention.
Figure 1B:
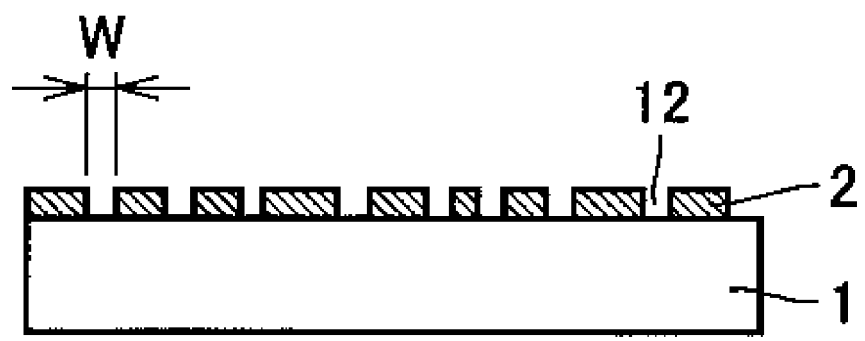
Figure 1C:
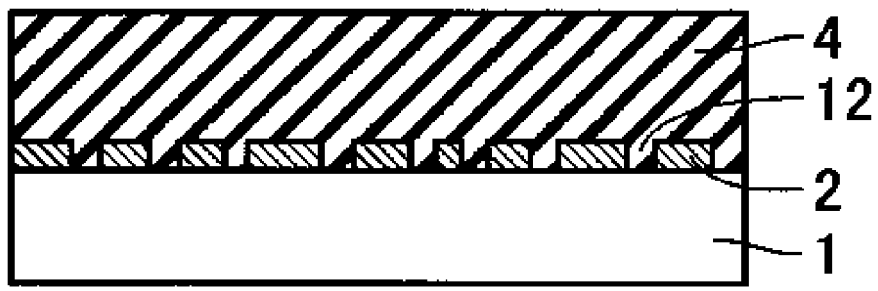

Referring to FIG. 1, one method of manufacturing a Group III-V crystal according to the present invention is characterized in comprising a step of depositing a metal film 2 on a substrate 1 as illustrated in FIG. 1A; a step, as represented in FIG. 1B, of heat-treating the metal film 2 under an atmosphere in which a patterning compound is present; and a step, as represented in FIG. 1C, of growing a Group III-V crystal 4 on the metal film after the heat treatment.

Figure 3A:
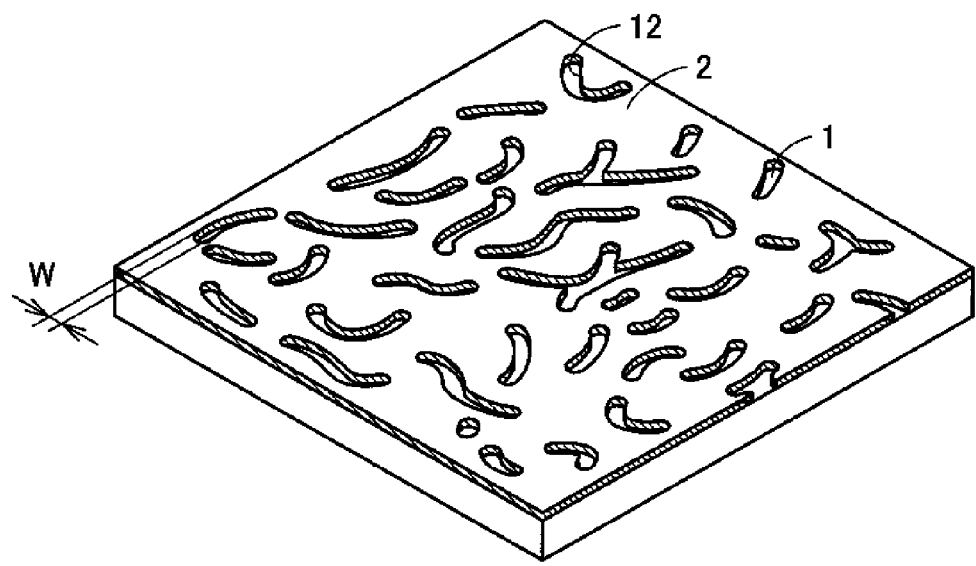
FIG. 3A is a schematic diagram illustrating one representative configuration of holes or grooves formed in a metal film.

Specifically, referring to FIGS. 1 and 3, a method of manufacturing a Group III-V crystal according to the present invention is carried out through the following steps. First, as illustrated in FIG. 1A, a metal film 2 is deposited on a substrate 1 using a physical vapor deposition technique such as evaporation or sputtering. Next, the metal film 2 is heat-treated under an atmosphere in which a patterning compound is present, whereby the metal film 2 becomes patterned in indefinite shapes as illustrated in FIG. 1B, forming holes or grooves 12 in a worm-eaten pattern, as illustrated in FIG. 3A as well as 3B, exposing the substrate 1 at the bottoms of the holes or grooves 12. Subsequently, as illustrated in FIG. 1C, a Group III-V crystal 4 is grown, using a technique such as a hydride vapor phase epitaxy (HVPE), onto the metal film 2 in which the holes or grooves 12 in a worm-eaten pattern have been formed following the heat treatment.

Figure 3B:
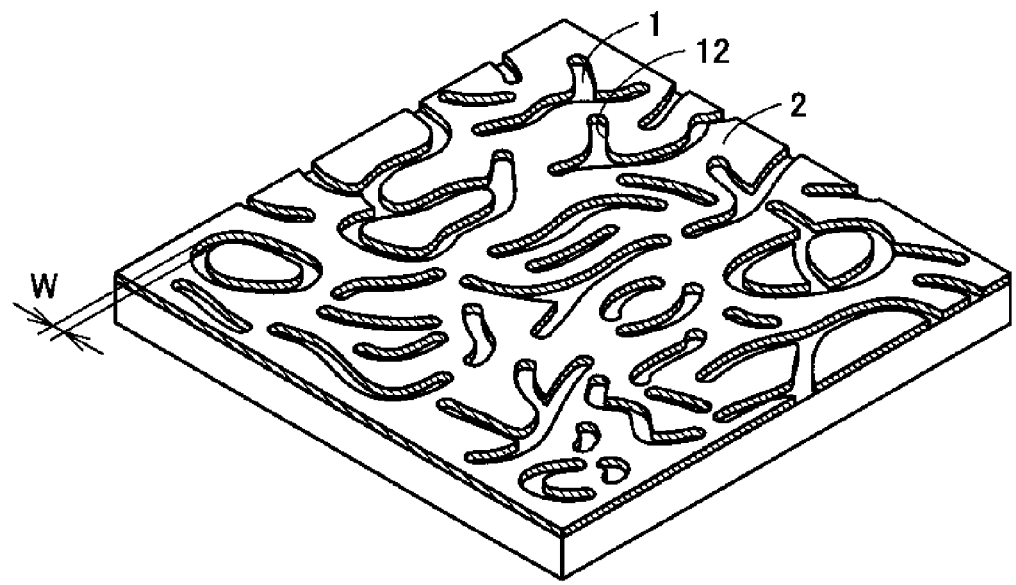
FIG. 3B is a schematic diagram illustrating another representative configuration of holes or grooves formed in a metal film.

Herein, each of FIGS. 3A and 3B schematically illustrates a representative configuration of holes or grooves in a worm-eaten pattern that are formed in the metal film 2 by heat-treating the metal film 2 under an atmosphere in which a patterning compound is present. When the number of holes or grooves is small, a configuration such as that of FIG. 3A tends to form, and as the number of holes or grooves increases, a configuration such as that of FIG. 3B tends to form. Furthermore, in some cases the worm-eaten holes or grooves form not just in the metal film 2, but also within the substrate 1.

By means of such a manufacturing method, a good-quality Group III-V crystal 4 is grown because, as will be seen from FIG. 1, the Group III-V crystal 4 can pick up information from the substrate 1 such as its crystal lattice constant. Moreover, the formation in the metal film, or in metallic compounds formed by the metal film reacting with the atmosphere gases employed in the patterning, of the pattern of holes or grooves 12 in worm-eaten contours alleviates the stress between the Group III-V crystal 4 and the metal film 2, preventing the Group III-V crystal 4 from forming cracks. Furthermore, the manufacturing cost is reduced because the Group III-V crystal can be produced by a vapor phase epitaxy (VPE) technique such as the HVPE technique mentioned above, rather than by the high-cost MOCVD technique.

Referring to FIGS. 1 and 3, in the Group III-V crystal manufacturing method according to the present invention, it is preferable that the holes or grooves formed in the metal film by heat-treating the metal film under an atmosphere in which a patterning compound is present have an average width W of 2 nm to 5000 nm and that the aperture fraction, which is the surface area that holes or grooves occupy, be 5% to 80% of the total area of the substrate. If the average width W of the holes or grooves is less than 2 nm, the holes or grooves as formed do not reach the substrate, making it difficult to read information from (that is, take on the characteristics of) the substrate. If on the other hand the average width W of the holes or grooves exceeds 5000 nm, it becomes difficult to alleviate stress between the Group III-V crystal and the substrate. Given these perspectives, it is further preferable that the average width W of the holes or grooves be from 5 nm to 1000 nm. Further, if the aperture fraction is less than 5% of the total area of the substrate, the smallness of the surface area in which the Group III-V crystal is in contact with the substrate would be prohibitive of the growing III-V crystal reading information from the substrate. If on the other hand the aperture fraction exceeds 80%, the excessively large extent to which the metal film is absent would be prohibitive of alleviating stress between the Group III-V crystal and the substrate. Given these perspectives, it is further preferable that the aperture fraction be 10% to 50% of the total area of the substrate. Herein, aperture fraction is defined as the percentage of surface area that the holes or grooves occupy with respect to the total area of the substrate, according to the following equation (1):

$$\text{Aperture fraction (\%)} = \frac{\text{(holes or grooves occupying area)}}{\text{(substrate total surface area)}} \times 100 \quad (1)$$

As for the substrate herein, a wide variety of substrates may be used, whether the same kind as or a different kind from the Group III-V crystal to be grown, as long as its use does not conflict with the object of the present invention. For example, substrates of materials such as silicon, sapphire, SiC, $ZrB_2$, ZnO and $Ga_2O_3$, substrates in which a Group III-V compound is formed onto the just-noted substrates, or Group III-V compounds are preferable, because the lattice constants of crystals of these compounds are similar to the lattice constant of the Group III-V crystals, and thus, good-quality crystals are readily produced. It should be noted that the Group III-V compound used for the substrate need not be the same compound as the Group III-V crystal that is to be grown thereon.

Although there are no restrictions on the metal film, a metal film containing titanium (Ti) or vanadium (V), including such metals and alloys as Ti, Ti—Al, V, and V—Al, is preferable from the viewpoint of readiness for patterning.

Although not particularly limited, the thickness of the metal film is preferably 10 nm to 1000 nm. A film thickness of less than 10 nm is prohibitive of causing the metal film to stay in the patterning operation, while the thickness exceeding 1000 nm is prohibitive of exposing the substrate in the patterning operation. In light of these factors, it is preferable that the thickness of the metal film be 30 nm to 500 nm.

A compound that patterns the metal film means a compound, which is preferably ammonia ($NH_3$), nitrogen ($N_2$), or compounds thereof, that when a metal film is heat-treated under an atmosphere in which the compound is present patterns into indefinite shapes holes or grooves in worm-eaten contours in the metal film. Likewise, preferable examples of atmospheres in which the patterning compound is present include mixed-gas atmospheres of hydrogen ($H_2$) with ammonia ($NH_3$), nitrogen ($N_2$), or compounds thereof.

Preferable heat-treating conditions for heat-treating of metal film in an atmosphere in which a patterning compound is present are temperatures of 800° C. to 1200° C. for a duration of 0.5 minutes to 20 minutes. If the heat-treatment temperature is less than 800° C. or the heat-treatment time is less than 0.5 minutes, insufficient patterning of the metal film results; if the heat-treatment temperature exceeds 1200° C. or the heat-treatment time exceeds 20 minutes, the metal film is patterned excessively. In light of these factors, it is preferable that the heat-treatment temperature be 900° C. to 1100° C. and the heat-treatment time 0.5 minutes to 10 minutes. Furthermore, the rate of ramp-up to the heat-treatment temperature when the metal film is patterned preferably is from 3° C./min to 150° C./min. If the ramping rate is less than 3° C./min, productivity suffers; if the ramping rate exceeds 150° C./min, the metal film sometimes peels off. From the foregoing perspectives, the ramping rate preferably is 5° C./min~100° C./min, more preferably 10° C./min~50° C./min. Also, it is desirable that the temperature distribution in the substrate location following ramp-up be controlled to be inside of 10° C. between the substrate center and substrate edge. If the distribution surpasses 10° C., the average width of the patterned holes or grooves in the metal film will vary widely between the substrate center and the substrate edge, and from the perspective that off-axis angle distribution in the crystal be large, it is preferable that the temperature distribution be controlled to be inside of 5° C. between the substrate center and the substrate edge.

The simple and low-cost manufacturing method described above yields good-quality Group III-V crystals. Furthermore, in cases in which the III-V crystals in the foregoing are $Ga_xAl_yIn_{1-x-y}$ ($0 \leq x \leq 1$ and $0 \leq y \leq 1$), because at present there is no other particularly serviceable manufacturing method for such crystals, the method proves to be an invaluable manufacturing technique.

Embodiment 2

Figure 2A:
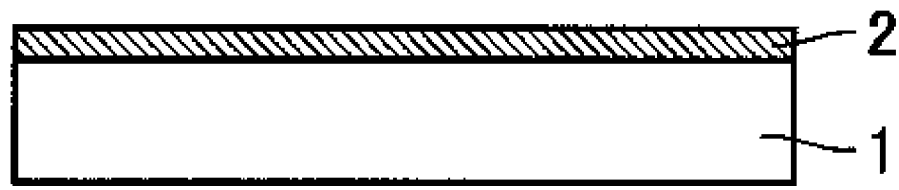
FIG. 2 illustrates another method of manufacturing a Group III-V crystal according to the present invention.
Figure 2B:
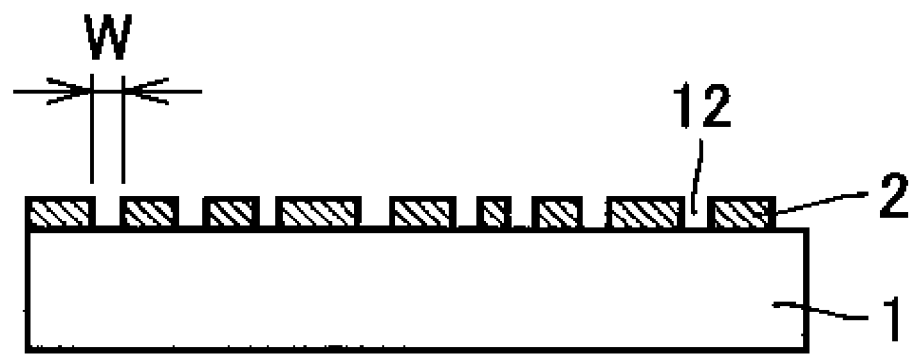
Figure 2C:
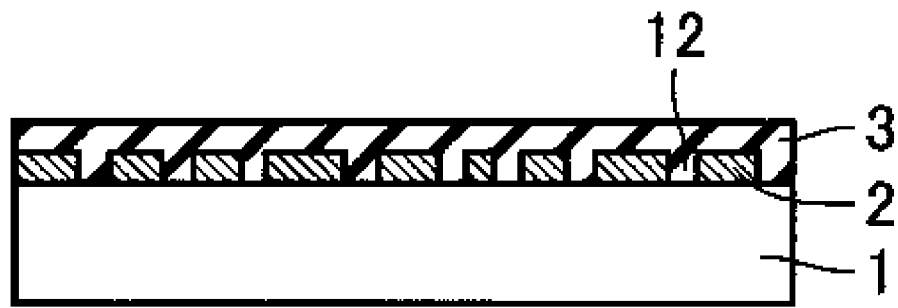
Figure 2D:
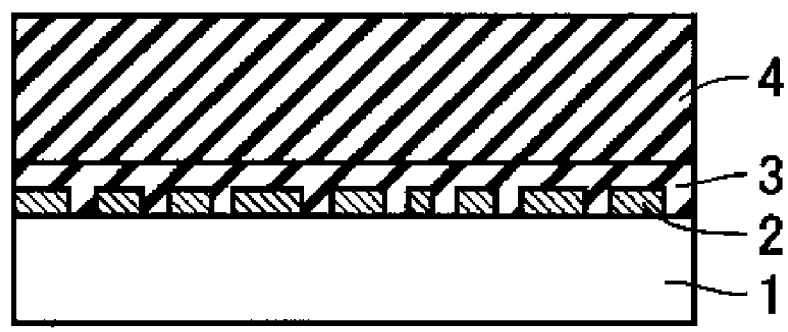

Referring to FIG. 2, another method of manufacturing a Group III-V crystal according to the present invention is characterized in comprising: a step of depositing a metal film 2 on a substrate 1 as illustrated in FIG. 2A; a step, as represented in FIG. 2B, of heat-treating the metal film in an atmosphere in which a patterning compound is present; a step, as represented in FIG. 2C, of growing a Group III-V compound buffer film 3 on the metal film 2 after the heat treatment; and a step, as represented in FIG. 2D, of growing a Group III-V crystal 4 on the Group III-V compound buffer film 3.

Specifically, referring to FIGS. 2 and 3, another method of manufacturing a Group III-V crystal according to the present invention is carried out through the following steps. First, as illustrated in FIG. 2A, a metal film 2 is deposited on a substrate 1 using a physical vapor deposition technique such as evaporation or sputtering. Next, the metal film 2 is heat-treated in an atmosphere in which a patterning compound is present, whereby the metal film 2 is patterned in indefinite shapes as illustrated in FIG. 2B, forming holes or grooves 12 in worm-eaten contours, as illustrated in FIG. 3A as well as 3B, so that the substrate 1 is exposed in the bottoms of the holes or grooves 12.

Next, using, for example, an HVPE technique a Group III-V compound buffer film 3 as illustrated in FIG. 2C is grown onto the post-heat-treated metal film 2 in which the holes or grooves 12 in worm-eaten contours are formed. Herein, the term "a Group III-V compound buffer film" 3 refers to an amorphous film of the Group III-V compound that is grown at a lower temperature than that for growing the crystal. Subsequently, as illustrated in FIG. 2D, a Group III-V crystal 4 is grown on the Group III-V compound buffer film 3, using, for example, an HVPE technique.

In Embodiment 2, described above, the formation onto the metal film 2 in which holes or grooves in a worm-eaten pattern have been formed makes it possible to alleviate the stress between the substrate 1 and the Group III-V crystal 4 that is later formed on the Group III-V compound buffer film 3. Moreover, because the Group III-V crystal 4 in growing picks up information not from the substrate 1 but from the amorphous III-V film, even better-quality III-V crystal— crystal that has not taken in unnecessary crystalline information—is produced.

Embodiment 3

Semiconductor electronic circuit elements utilizing III-V compound crystal involving the present invention include devices such as LEDs, LDs, Schottky barrier diodes, and transistors. Since larger size III-V compound crystal means that a greater number of semiconductor devices can be fabricated from a single III-V compound crystal, it is preferable that at least a 2-inch diameter, more preferably at least a 3-inch diameter, still more preferably at least a 5-inch diameter III-V compound crystal be utilized. From the perspective of making the properties of semiconductor devices obtained from a single III-V compound crystal uniform, preferably a III-V compound crystal in which the carrier concentration, resistivity, and dislocation density of the III-V compound crystal are uniform to within ±30% variation along the surface is selected and utilized. According to the present invention, the variation is calculated by the formula: (A−B)/A*100 [%], wherein A is a measurement at the center of the substrate, and B is a measurement at another point, separated from the center and being that length which is 80% of the distance from the center to the substrate edge. And in implementations in which the front side of the III-V compound crystal is nearly a (0001)-plane crystal face, the angle (off-axis angle) that the crystal front side forms with the (0001) plane preferably does not include any region where it is 0° along the III-V compound crystal surface. Furthermore, the full width at half-maximum in XRD at the crystal center of the III-V compound is preferably from 50 to 150 arcsec, more preferably from 50 to 120 arcsec or less. Further, the III-V compound crystal preferably has carrier concentration from $6\times10^{17}/cm^3$ to $9.5\times10^{18}/cm^3$, and the resistivity of the III-V compound crystal preferably is from 0.008 to 0.1 Ω-cm.

Also, in accordance with the present invention, when GaN substrates were produced by varying, as given in (1) through (4) below, the off-axis angle of a 5.5-inch sapphire or like substrate, with any of the substrates produced, the difference in off-axis angle at the crystal center and at 50.8 mm from the center—i.e., at the center and at the different point (a point separated from the center and being the length that is 80% of distance from the center to the substrate edge)—fell within the range of from 0.01° to 0.3° in every case. And on characterizing, by x-rays through a 200 μm×200 μm slit aperture, the obtained substrates at the center, with FWHMs of 50 to 150 arcsec, the crystals all were of good quality. It will be appreciated that with the misorientation direction of the sapphire substrate being in a <11$\bar{2}$0> direction, the off-axis angle of the GaN substrate forms along a <10$\bar{1}$0> direction of the GaN crystal, and with the misorientation direction of the sapphire substrate being in <10$\bar{1}$0> direction, the off-axis angle of the GaN substrate forms in a <11$\bar{2}$0> direction of the GaN crystal.

(1) Off-axis angle of the sapphire substrate in a <11$\bar{2}$0> direction, 0.02°; in a <10$\bar{1}$0> direction, 0.02°:

In this case, off-axis angle of the obtained GaN substrate in a <11$\bar{2}$0> direction, 0.02°; in a <10$\bar{1}$0> direction, 0.02°.

(2) Off-axis angle of the sapphire substrate in a <11$\bar{2}$0> direction, 20°; in a <10$\bar{1}$0> direction, 0.02°:

In this case, off-axis angle of the obtained GaN substrate in a <11$\bar{2}$0> direction, 0.02°; in a <10$\bar{1}$0> direction, 19.8°.

(3) Off-axis angle of the sapphire substrate in a <11$\bar{2}$0> direction, 0.02°; in a <10$\bar{1}$0> direction, 20°:

In this case, off-axis angle of the obtained GaN substrate in a <11$\bar{2}$0> direction, 19.8°; in a <10$\bar{1}$0> direction, 0.02°.

(4) Off-axis angle of the sapphire substrate in a <11$\bar{2}$0> direction, 20°; in a <10$\bar{1}$0> direction, 20°:

In this case, off-axis angle of the obtained GaN substrate in a <11$\bar{2}$0> direction, 19.8°; in a <10$\bar{1}$0> direction, 19.8°.

EXAMPLES

The foregoing Embodiments 1, 2 and 3 will be further detailed based on specific examples.

Example 1

Reference is made to FIG. 1. Based on Embodiment 1, by an evaporation technique a 30 nm-thick metallic Ti film was deposited as a metal film 2 on a substrate 1, as illustrated in FIG. 1A, using a sapphire base as the substrate 1. Next, as represented in FIG. 1B the metal film 2 was heat-treated within a $NH_3$ atmosphere at 1000° C. for 0.5 minutes. The surface of the metal film 2 after its temperature was lowered was observed with a scanning electron microscope (SEM). Holes or grooves in a worm-eaten pattern as shown in FIG. 3A were found; the average width W of the holes or grooves was 8 nm and the aperture fraction was 12%. In addition, a Group III-V crystal 4 as illustrated in FIG. 1C was grown at 1000° C. for a 5-hour duration by an HVPE technique using Ga and $NH_3$ as source materials, resulting in a crystal free of cracks. The resulting crystal was found to be a good-quality GaN crystal by an XRD measurement, with its full width at half-maximum (FWHM) in the XRD being 120 arcsec. The results are set forth in Table I.

Examples 2 to 12

With the test conditions set out in Table I, Group III-V crystals were grown by the same procedure as in Example 1. The results are summarized in Table I.

TABLE I

|  | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 |
|---|---|---|---|---|---|---|---|---|---|---|---|---|
| Substrate type | Sapphire | Sapphire | GaAs | Sapphire | Si | AlN | $ZrB_2$ | GaN | SiC | Sapphire | Sapphire | Si |
| Metal film Class (Composition: mole %) | Ti | Ti | Ti | Ti | Ti | Ti | Ti | Ti (90) Al (10) | V | V | Ti | Ti |
| Film thickness (nm) | 30 | 200 | 200 | 200 | 200 | 500 | 200 | 300 | 200 | 200 | 200 | 200 |
| Heat treatment Atmosphere (Composition: mole %) | $NH_3$ | $NH_3$ | $NH_3$ | $NH_3$ | $NH_3$ | $N_2$ | $NH_3$ (40) $H_2$ (60) | $NH_3$ | $NH_3$ | $NH_3$ | $NH_3$ | $NH_3$ |
| Temp. (° C.) | 1000 | 800 | 1000 | 1000 | 1100 | 1200 | 1000 | 1000 | 1000 | 1000 | 1000 | 1100 |
| Duration (min.) | 0.5 | 10 | 6 | 3 | 3 | 10 | 3 | 3 | 3 | 2 | 3 | 3 |
| Hole/groove width (nm) | 8 | 10 | 110 | 31 | 280 | 900 | 32 | 26 | 29 | 18 | 31 | 280 |
| Aperture fraction (%) | 12 | 25 | 34 | 22 | 45 | 75 | 22 | 18 | 11 | 8 | 22 | 38 |
| Crystal growth Source material 1 (Composition: mole %) | Ga | Ga | Ga | Ga | Ga | Ga | Ga | Ga | Ga | Ga (80) Al (10) In (10) | Al | Ga (70) Al (30) |
| Source material 2 (Composition: mole %) | $NH_3$ | $NH_3$ | $NH_3$ | $NH_3$ | $NH_3$ | $NH_3$ | $NH_3$ | $NH_3$ | $NH_3$ | $NH_3$ | $NH_3$ | $NH_3$ |
| Temp. (° C.) | 1000 | 1100 | 1000 | 1000 | 1100 | 1000 | 1000 | 1000 | 1100 | 1000 | 1000 | 1100 |
| Duration (hrs.) | 5 | 5 | 5 | 5 | 5 | 5 | 5 | 5 | 5 | 5 | 5 | 5 |
| Cracking incidents | None | None | None | None | None | None | None | None | None | None | None | None |
| Crystal composition (XRD-identified) | GaN | GaN | GaN | GaN | GaN | GaN | GaN | GaN | GaN | $Ga_{0.8}Al_{0.1}In_{0.1}N$ | AlN | $Ga_{0.7}Al_{0.3}N$ |
| XRD FWHM (arcsec) | 120 | 120 | 103 | 110 | 105 | 108 | 118 | 135 | 138 | 150 | 115 | 97 |

Example 13

Reference is made to FIG. 2. Based on Embodiment 2, by an evaporation technique a 200 nm-thick metallic Ti film was deposited as a metal film 2 on a substrate 1, as illustrated in FIG. 2A, using a sapphire base as the substrate 1. Next, as represented in FIG. 2B the metal film 2 was heat-treated in a $NH_3$ atmosphere at 1000° C. for 3 minutes. The surface of the metal film 2 after its temperature was lowered was observed with an SEM. Holes or grooves in a worm-eaten pattern as shown in FIG. 3A were found; the average width W of the holes or grooves was 31 nm and the aperture fraction was 22%. Next, a Group III-V compound buffer film 3 as illustrated in FIG. 2C was grown at 500° C. for a 0.5-hour duration. Then, a Group III-V crystal 4 as illustrated in FIG. 2D was grown at 1000° C. for a 5-hour duration by an HVPE technique using Ga and $NH_3$ as source materials, resulting in a crystal free of cracks. The resulting crystal was found to be a good-quality GaN crystal by an XRD measurement, with its FWHM in the XRD being 80 arcsec. The results are set forth in Table I.

Examples 14 to 20

With the test conditions set out in Table II, Group III-V crystals were grown in the same procedure as in Example 13. The results are summarized in Table II.

TABLE II

|  |  | Ex. 13 | Ex. 14 | Ex. 15 | Ex. 16 | Ex. 17 | Ex. 18 | Ex. 19 | Ex. 20 |
|---|---|---|---|---|---|---|---|---|---|
| Substrate type |  | Sapphire | Si | GaAs | AlN | GaN | SiC | Sapphire | Si |
| Metal film | Class (Comp.: mole %) | Ti | Ti | Ti | Ti | Ti (90) Al (10) | V | Ti | Ti |
|  | Film thickness (nm) | 200 | 200 | 200 | 500 | 300 | 200 | 200 | 200 |
| Heat treatment | Atmosphere (Comp.: mole %) | $NH_3$ | $NH_3$ | $NH_3$ | $N_2$ | $NH_3$ | $NH_3$ | $NH_3$ | $NH_3$ |
|  | Temp. (° C.) | 1000 | 1100 | 1000 | 1200 | 1000 | 1000 | 1000 | 1100 |
|  | Duration (min.) | 3 | 3 | 6 | 10 | 3 | 3 | 3 | 3 |
| Hole/groove width (nm) |  | 31 | 280 | 110 | 900 | 26 | 29 | 31 | 280 |
| Aperture fraction (%) |  | 22 | 45 | 34 | 75 | 18 | 11 | 22 | 38 |
| Buffer film growth | Source material 1 (Comp.: mole %) | Ga | Ga | Al | Ga | Ga | Ga | Al | Ga (70) Al (30) |
|  | Source material 2 (Comp.: mole %) | $NH_3$ | $NH_3$ | $NH_3$ | $NH_3$ | $NH_3$ | $NH_3$ | $NH_3$ | $NH_3$ |
|  | Temp. (° C.) | 500 | 500 | 500 | 500 | 500 | 500 | 500 | 500 |
|  | Duration (hrs.) | 0.5 | 0.5 | 0.5 | 0.5 | 0.5 | 0.5 | 0.5 | 0.5 |
| Crystal growth | Source material 1 (Comp.: mole %) | Ga | Ga | Ga | Ga | Ga | Ga | Al | Ga (70) Al (30) |
|  | Source material 2 (Comp.: mole %) | $NH_3$ | $NH_3$ | $NH_3$ | $NH_3$ | $NH_3$ | $NH_3$ | $NH_3$ | $NH_3$ |
|  | Temp. (° C.) | 1000 | 1100 | 1000 | 1000 | 1000 | 1000 | 1000 | 1100 |
|  | Duration (hrs.) | 5 | 5 | 5 | 5 | 5 | 5 | 5 | 5 |

TABLE II-continued

|  | Ex. 13 | Ex. 14 | Ex. 15 | Ex. 16 | Ex. 17 | Ex. 18 | Ex. 19 | Ex. 20 |
|---|---|---|---|---|---|---|---|---|
| Cracking incidents | None | None | None | None | None | None | None | None |
| Crystal composition (XRD-identified) | GaN | GaN | GaN | GaN | GaN | GaN | AlN | $Ga_{0.7}Al_{0.3}N$ |
| XRD FWHM (arcsec) | 80 | 65 | 72 | 85 | 88 | 92 | 90 | 78 |

As is evident from Tables I and II, good-quality Group III-V crystals that are free from cracks were obtained in all of the examples. Furthermore, it will be understood from comparisons, for example, between Examples 4 and 13, and between Examples 11 and 19, that the FWHMs of the crystals in the XRD analysis were reduced from 110 arcsec to 80 arcsec and from 115 arcsec to 90 arcsec, respectively, and that growing the buffer film prior to growing a Group III-V crystal improved the quality of the crystals further.

Example 21

Reference is made to FIG. 1. Based on Embodiment 1, by an evaporation technique a metallic Ti film was deposited 30 nm as a metal film 2 onto a substrate 1, as illustrated in FIG. 1A, using as the substrate 1 a 2.5-inch sapphire substrate misoriented 0.3° from the c-plane. Next, the metal film 2 as represented in FIG. 1B was ramped up at 15° C./min to 1050° C. within an atmosphere in which $H_2$ and 75% $N_2$ were mixed, and then was heat-treated for 0.5 minutes. When the surface of the metal film 2 after its temperature lowered was observed with a scanning electron microscope (SEM), holes or grooves in a worm-eaten pattern as shown in FIG. 3A were found, with the average width W of the holes or grooves being 12 nm and the aperture fraction being 15%. Further, a Group III-V compound crystal 4 as illustrated in FIG. 1C was grown at 1000° C. over a 5-hour period by an HVPE process using Ga and $NH_3$ as source materials, whereupon a crack-free crystal was obtained. The sapphire substrate was removed from the obtained crystal. Thereafter the perimeter and the front and back sides were ground and the front side was polished, yielding a 2-inch diameter crystal. An XRD analysis was carried out on the crystal, whereupon the crystal was identified to be GaN crystal, and a crystal of good quality, with its full width at half-maximum (FWHM) in XRD at the crystal center being 80 arcsec, the off-axis angle at the crystal center being 0.3°, and the difference in off-axis angle between the crystal center and at 20 mm from the center being 0.2°. The results are set forth in Table III.

Example 22

Reference is made to FIG. 1. Based on Embodiment 1, by an evaporation technique a metallic Ti film was deposited 30 nm as a metal film 2 onto a substrate 1, as illustrated in FIG. 1A, using as the substrate 1 a 2.5-inch sapphire substrate misoriented 0.3° from the c-plane. Next, the metal film 2 as represented in FIG. 1B was ramped up at a 20° C./min ramping rate within an atmosphere in which $H_2$ and 95% $N_2$ were mixed, and was heat-treated at 1050° C. for 0.5 minutes. When the surface of the metal film 2 after its temperature lowered was observed with a scanning electron microscope (SEM), holes or grooves in a worm-eaten pattern as shown in FIG. 3A were found, with the average width W of the holes or grooves being 12 nm and the aperture fraction being 15%. Further, a Group III-V compound crystal 4 as illustrated in FIG. 1C was grown 5 mm at 1000° C. over a 50-hour period by an HVPE process using Ga and $NH_3$ as source materials, whereupon a crack-free crystal was obtained. The sapphire substrate was removed from the obtained crystal. Thereafter the crystal was sliced with a wire saw into wafers, and the perimeter and the front and back sides of the obtained wafers were ground and their front side was polished, yielding 8 crystals of 2-inch diameter (50.8 mm) and 400 μm thickness. An XRD analysis was carried out on these crystals, whereupon every one of them was GaN crystal, and a crystal of good quality, with its full width at half-maximum (FWHM) in XRD at the crystal center being 80 arcsec, the off-axis angle in a <11$\bar{2}$0> direction being 0.3° and the off-axis angle in a <10$\bar{1}$0> direction being 0.03° at the crystal center, and the difference in off-axis angle between the crystal center and at 20.3 mm from the center being 0.2° (i.e., the difference in the two off-axis angles at the center, and at a point separated a length from the center that is 80% of the distance to the substrate edge, is 0.2°). Further, cathodoluminescence (CL) was employed to characterize the dislocation density in 200 μm² regions in the vicinity of the crystal center and at 4 sites separated 20.3 mm from the center, whereupon the dislocation density of the crystal in its initial growth stage, at the center and in the sites separated 20.3 mm from the center, was $9\times10^5/cm^2$ and $1.1\times10^6/cm^2$ respectively, which, falling within a ±30% range, proved to be uniform. In addition, as far as the dislocation density of the crystal in its final growth stage was concerned, the dislocation density at the center and in the sites separated 20.3 mm from the center was $5\times10^5/cm^2$ and $4\times10^5/cm^2$ respectively, which, falling within a ±20% range, proved to be uniform.

Example 23

Reference is made to FIG. 1. Based on Embodiment 1, by an evaporation technique a metallic Ti film was deposited 50 nm as a metal film 2 onto a substrate 1, as illustrated in FIG. 1A, using as the substrate 1 a 5.5-inch sapphire substrate misoriented 0.5° from the c-plane. Next, the metal film 2 as represented in FIG. 1B was ramped up at a 20° C./min to 1070° C. ramping rate within an atmosphere in which $H_2$ and 60% $N_2$ were mixed, and then was heat-treated for 0.5 minutes. When the surface of the metal film 2 after its temperature lowered was observed with a scanning electron microscope (SEM), holes or grooves in a worm-eaten pattern as shown in FIG. 3A were found, with the average width W of the holes or grooves being 15 nm and the aperture fraction being 18%. Further, a Group III-V compound crystal 4 as illustrated in FIG. 1C was grown 5 mm at 1000° C. over a 50-hour period by an HVPE process using Ga and $NH_3$ as source materials, while being doped with Si, whereupon a crack-free crystal was obtained. The sapphire substrate was removed from the obtained crystal. Thereafter the crystal was sliced with a wire saw into wafers, and the perimeter and the front and back sides of the obtained wafers were ground and their front side was polished, yielding 8 crystals of 5-inch (i.e., 127 mm) diameter and 400 μm thickness. An XRD analysis was carried out on these crystals, whereupon every one of them was GaN crystal, and a crystal of good quality, with its full width at half-maximum (FWHM) in XRD at the crystal center being 85 arcsec, the off-axis angle in a <11$\bar{2}$0> direction being 0.5° and the off-axis angle in a <10$\bar{1}$0> direction being 0.03° at the crystal center, and the difference in off-axis angle between the crystal center and at 50.8 mm from the center being 0.2° (i.e., the difference in the two off-axis angles at the center, and at a point separated a length from the center that is 80% of the distance to the substrate edge, is 0.2°). Further, cathodoluminescence (CL) was employed to characterize the dislocation density in 200 μm² regions in the vicinity of the crystal center and at 4 sites separated 50 mm from the center, whereupon the dislocation density of the crystal in its initial growth stage, at the center and in the sites separated 50.8 mm from the center, was $9.5 \times 10^5$/cm² and $1.2 \times 10^6$/cm² respectively, which, falling within a ±30% range, proved to be uniform. In addition, as far as the dislocation density of the crystal in its final growth stage was concerned, the dislocation density at the center and in the sites separated 50.8 mm from the center was $5 \times 10^5$/cm² and $4 \times 10^5$/cm² respectively, which, falling within a ±20% range, proved to be uniform. Furthermore, the carrier concentration and resistivity of a crystal 10 mm square, cut out from the vicinity of the center of the crystal in its initial growth stage, were analyzed using Hall measurements, with the result being that the carrier concentration was $1 \times 10^{18}$/cm³ and the resistivity was 0.1 Ω-cm; while the carrier concentration and resistivity of crystals 10 mm square, cut out from 4 sites separated 50.8 mm from the center, ranged from $8 \times 10^{18}$ to $9.5 \times 10^{18}$/cm³ and from 0.1 to 0.12 Ω-cm, respectively— wherein the variation was ±30%. Thus the carrier concentration and resistivity were uniform in the crystal surface. Following the Hall measurements, the crystals were each analyzed by SIMS for quantity of 5 impurities, with the result being that $1 \times 10^{18}$/cm³ Si added as a dopant, and other than that, only $4 \times 10^{17}$/cm³ H and $2 \times 10^{15}$/cm³ Cl, were detected. The results are summarized in Table III.

TABLE III

| | | Ex. 21 | Ex. 22 | Ex. 23 |
|---|---|---|---|---|
| Substrate type | | Sapphire | Sapphire | Sapphire |
| Metal film | Class | Ti | Ti | Ti |
| | (Comp.: mole %) | | | |
| | Film thickness (nm) | 30 | 30 | 50 |
| Heat treatment | Atmosphere (Comp.: mole %) | N$_2$ (75) H$_2$ (25) | N$_2$ (95) H$_2$ (5) | N$_2$ (60) H$_2$ (40) |
| | Temp. (° C.) | 1050 | 1050 | 1070 |
| | Ramping rate (° C./min) | 15 | 20 | 20 |
| | Duration (min.) | 0.5 | 0.5 | 0.5 |
| Hole/groove width (nm) | | 12 | 12 | 15 |
| Aperture fraction (%) | | 15 | 15 | 18 |
| Crystal growth | Source material 1 (Comp.: mole %) | Ga | Ga | Ga |
| | Source material 2 (Comp.: mole %) | NH$_3$ | NH$_3$ | NH$_3$ |
| | Temp. (° C.) | 1000 | 1000 | 1000 |
| | Duration (hrs.) | 5 | 50 | 50 |
| Cracking incidents | | None | None | None |
| Crystal composition (XRD-identified) | | GaN | GaN | GaN |
| XRD FWHM (arcsec) | | 80 | 80 | 85 |

Example 24

Utilizing a 2-Inch GaN Substrate Obtained in Example 22 to Fabricate LEDs

Figure 4:
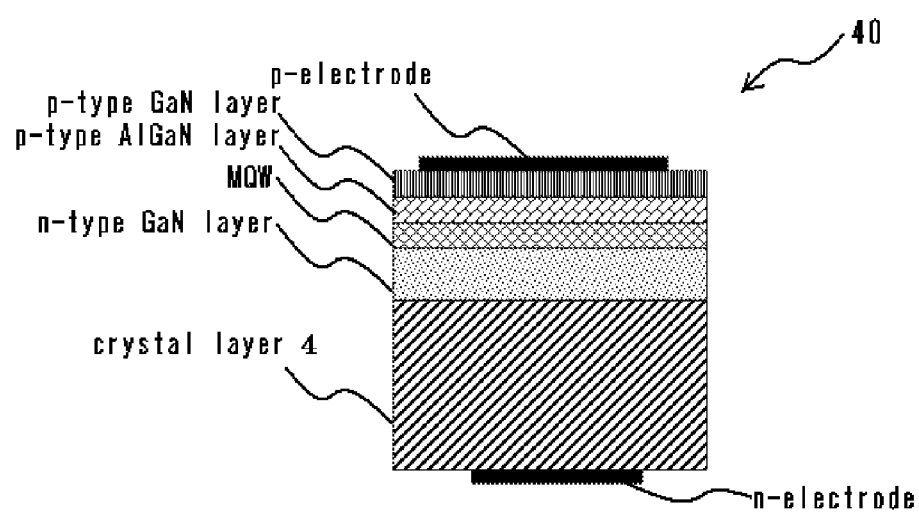
FIG. 4 is a diagram for explaining an LED fabricated utilizing III-V compound crystal involving the present invention.

With reference to FIG. 4, an LED 40 as a semiconductor device involving Embodiment 3 of the present invention was fabricated utilizing a GaN substrate produced by the method described above. The detailed manufacturing process is as follows.

Onto a GaN substrate 4 of Example 22, as at least single-lamina III-nitride semiconductor layers an n-type GaN layer of 5 μm thickness, a multiquantum well structure (MQW) composed of three layers of $In_{0.2}Ga_{0.8}N$ (each layer 3 nm in thickness) and four layers of GaN (each layer 10 nm in thickness), an $Al_{0.2}Ga_{0.8}N$ layer of 60 nm thickness, and a p-type GaN layer of 150 nm thickness were grown epitaxially in that order by MOCVD.

Further, a p-side electrode of 100 nm thickness was formed on the surface of the p-type GaN layer. Next, in order to facilitate segmentation of the substrate into chips, the p-type GaN layer face was pasted onto a polishing holder, and then polishing that employed a slurry containing SiC grit of 30 μm average particle diameter was carried out until the thickness of the GaN substrate went from 400 μm to 100 μm.

After that, n-side electrodes of 80 μm diameter×100 nm thickness were formed in locations on the back side of the GaN substrate that when segmented into chips would become the central portions, and then the substrate was segmented into 400 μm×400 μm chips. LEDs were fabricated according to the foregoing.

An evaluation of yields with regard to the LEDs fabricated as described above was conducted in the following manner. At first, among LEDs fabricated by the aforedescribed method, the light-emitting intensity of those devices located inside of a 2.5 mm diameter from the center (in a center region) of the GaN substrate before segmentation was measured, and the average Av and the standard deviation σ were computed. After that, among all of the devices fabricated from the GaN substrate, 500 devices were taken from the area other than the center region, and then the light-emitting intensity thereof was measured, and those having a result that was at least the difference (Av−σ) between the average and the standard deviation of the light-emitting intensities of the devices in the center regions were taken as passing, and the device pass rate(%)=passing device count/total device count×100 was found.

The result the foregoing: A high yield of 83% could be gained with the fabricated semiconductor devices (LEDs).

Example 25

Utilizing a 2-Inch GaN Substrate Obtained in Example 22 to Fabricate LDs

Figure 5A:
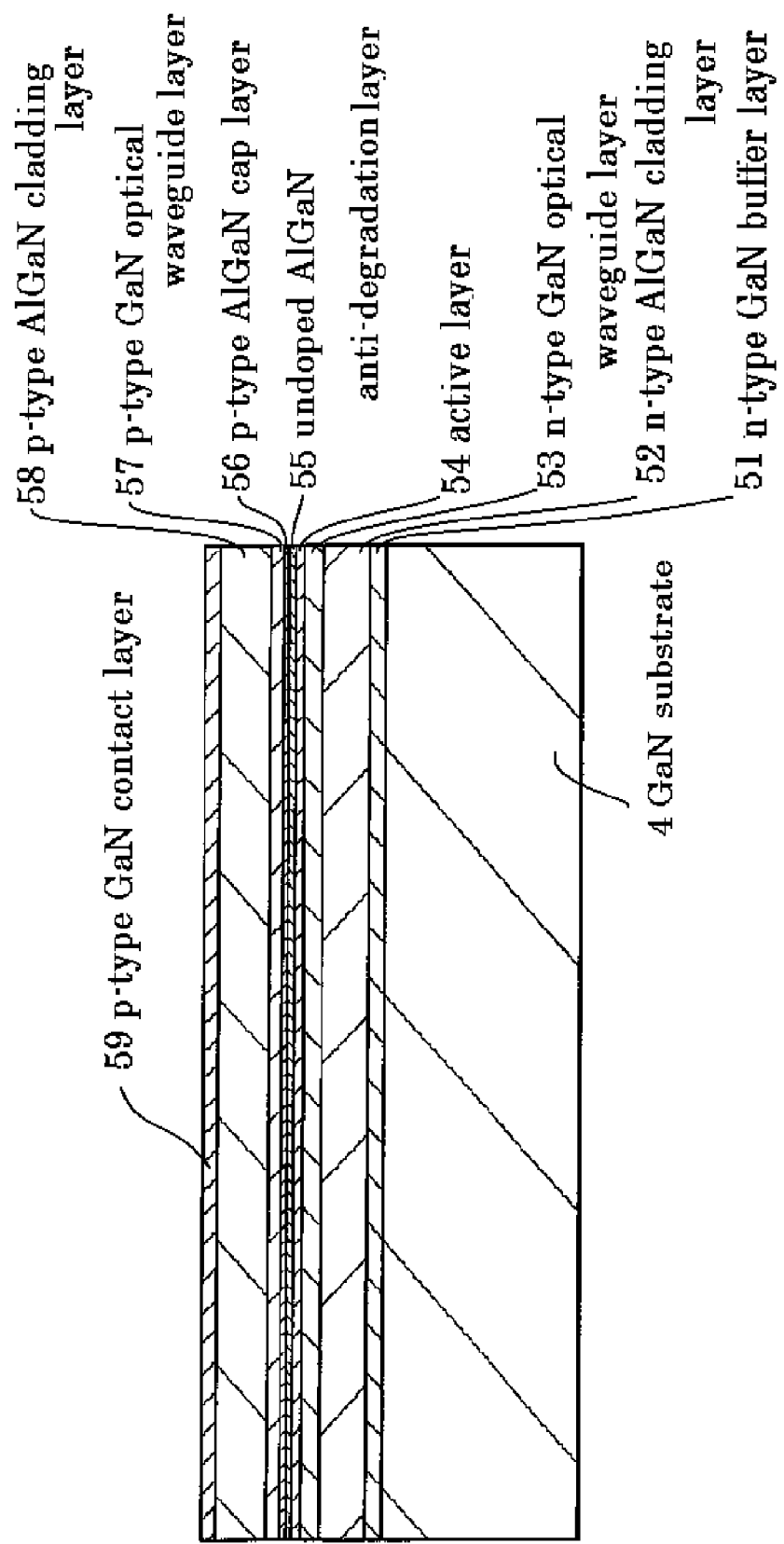
FIG. 5A is a diagram for explaining an LD fabricated utilizing III-V compound crystal involving the present invention.
Figure 5B:
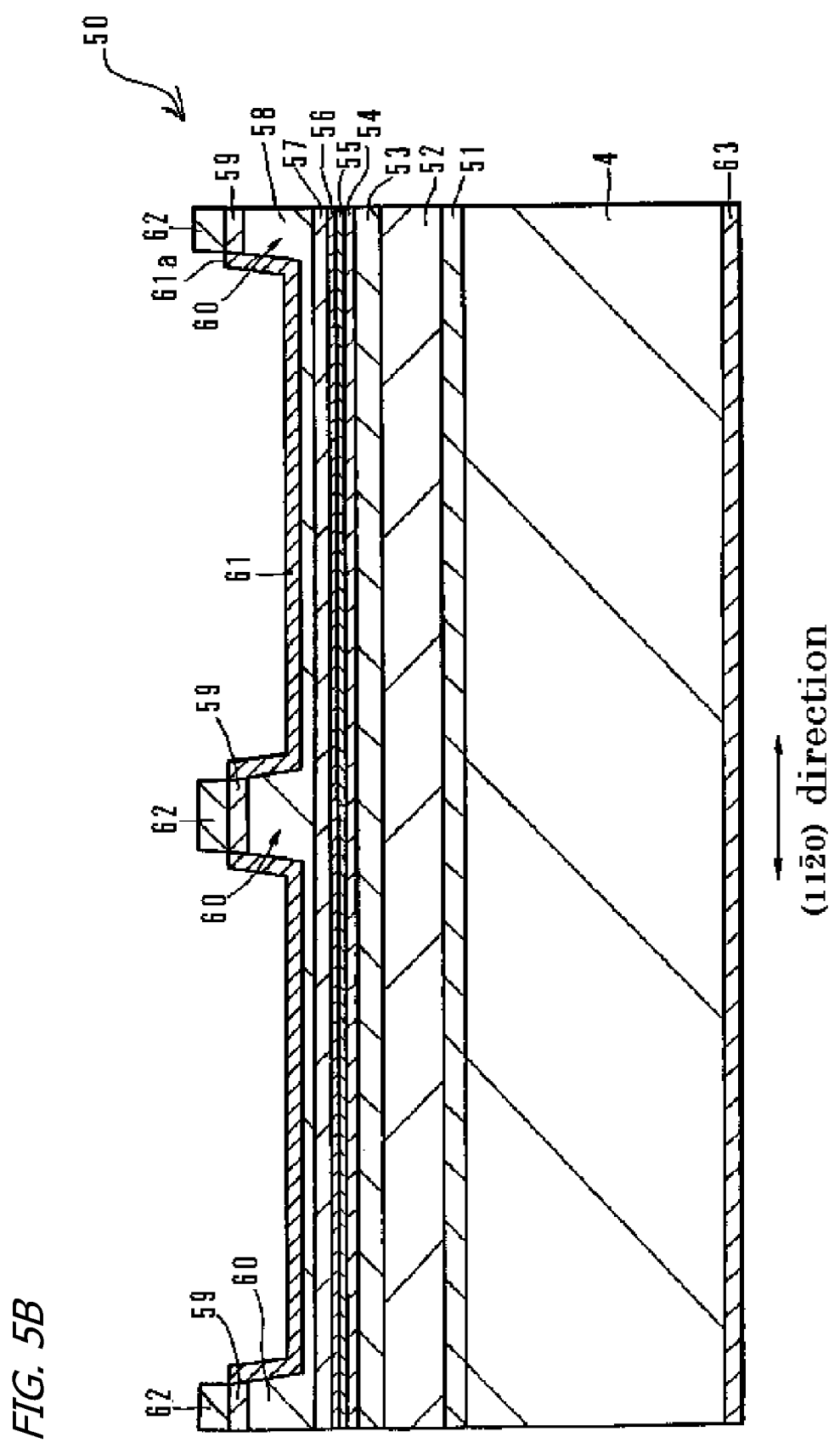
FIG. 5B is a diagram for explaining an LD fabricated utilizing III-V compound crystal involving the present invention.

With reference to FIGS. 5A and 5B, an LD 50 as a semiconductor device involving Embodiment 3 of the present invention was fabricated utilizing a GaN substrate produced by the method described above. The detailed manufacturing process is as follows.

Onto the surface of a GaN substrate 4 of 400 μm thickness, as III-nitride semiconductor layers an Si-doped, n-type GaN buffer layer 51 of 0.05 μm thickness, an Si-doped, n-type $Al_{0.08}Ga_{0.92}N$ cladding layer 52 of 1.0 μm thickness, an Si-doped, n-type GaN optical waveguide layer 53 of 0.1 μm thickness, an active layer 54, a multiquantum-well layer structure in which an undoped $In_{0.15}Ga_{0.85}N$ layer of 3 nm thickness and an $In_{0.03}Ga_{0.97}N$ layer of 6 nm thickness are repeated 5 times, an undoped, $Al_{0.2}Ga_{0.8}N$ anti-degradation layer 55 of 0.01 μm thickness, a magnesium (Mg) doped p-type $Al_{0.2}Ga_{0.8}N$ cap layer 56 of 10 nm thickness, an Mg-doped, p-type GaN optical waveguide layer 57 of 0.1 μm thickness, an Mg-doped, p-type $Al_{0.08}Ga_{0.92}N$ cladding layer 58 of 0.3 μm thickness, and an Mg-doped, p-type GaN contact layer 59 were grown epitaxially in that order by MOCVD, and then the GaN substrate was taken out of the MOCVD apparatus. Following that, an $SiO_2$ film of 0.1 μm thickness was formed by CVD over the entire surface of the p-type GaN contact layer, and then a pattern corresponding to the geometry of ridges was formed by lithography onto the $SiO_2$ film.

Next, with the $SiO_2$ film as a mask, etching by an RIE process was carried out to a predetermined depth thicknesswise into the p-type AlGaN cladding layer, whereby ridges 60 extending in a $<1\bar{1}00>$ direction were formed. The width of these ridges was 2 μm. Gaseous chlorine was employed as the etchant gas in the RIE.

Next, the $SiO_2$ film that had been employed as an etching mask was etched away, and then an $SiO_2$ insulating film 61 of 0.3 μm thickness was coated over the entire substrate surface using an CVD process. Following that, a patterned resist was formed covering the insulating-film surface over the region except for the region where the p-side electrode would be formed by lithography. With the patterned resist as a mask, the insulating film was etched to form aperture portions 61*a*.

Next, with the patterned resist left as it was, p-side electrode material was formed by a vacuum evaporation process over the entire substrate surface, and then the patterned resist and the p-side electrode material formed onto it were removed together, creating a p-side electrode 62 on the p-type GaN contact layer alone. In order to facilitate segmentation into chips, the p-type GaN layer face was pasted onto a polishing holder, and then polishing that employed a slurry containing SiC grit of 30 μm average particle diameter was carried out until the thickness of the GaN substrate went from 400 μm to 100 μm.

Next an n-side electrode 63 was formed onto the back side of the GaN substrate. After that, scribing of the GaN substrate where the laser structure described above was formed was carried out by cleaving along the contour lines of the device region, the cleaved substrate was processed into bar form, and a pair of resonant cavity endfaces was created. Next, endface coating was implemented on the resonant cavity endfaces, and once again, scribing of this laser bar was carried out by cleaving or a like operation, singulating the bar into chips.

LDs were fabricated by the method set forth above, and the yield was evaluated. The method whereby the yield was evaluated was the same as that described above for the LEDs, but as the LD device characteristic, laser lifespan was used. The device pass rate of 65% was obtained for 50 devices randomly taken from the area other than the center region. The result of the foregoing: High yields could be gained.

It should be understood that the presently disclosed embodiments and examples are in all respects illustrative and not limiting. The scope of the present invention is set forth not by the foregoing description but by the scope of the patent claims, and is intended to include meanings equivalent to the scope of the patent claims and all modifications within the scope.

INDUSTRIAL APPLICABILITY

As described in the foregoing, in accordance with the present invention, the provision of a step of depositing a metal film on a substrate, a step of heat-treating the metal film in an atmosphere in which a patterning compound is present, and a step of growing a Group III-V crystal on the metal film after the heat treatment, yields good-quality Group III-V crystals without causing cracks, using a simple and low-cost manufacturing method. Since semiconductor devices of the present invention are fabricated utilizing III-V compound crystal free of any incidence of cracking, manufacturing with good quality and at high yields is possible.

What is claimed is:

1. A III-V compound crystal for a semiconductor electronic circuit element, the III-V crystal characterized by the following properties:

the carrier concentration, resistivity, and dislocation density of the III-V compound crystal are uniform to within ±30% variation along the surface;

the III-V compound crystal is misoriented from the c-plane such that the crystal surface does not include any region where its off-axis angle with the c-plane is 0°; and the full width at half-maximum in XRD at the crystal center of the III-V compound is not greater than 150 arcsec.

2. A III-V compound crystal as set forth in claim 1, wherein the carrier concentration of the III-V compound crystal is from $6\times10^{17}/cm^3$ to $9.5\times10^{18}/cm^3$, and the resistivity of the III-V compound crystal is from 0.008 to 0.1 Ω-cm;

the off-axis angle at the crystal center in a $<11\bar{2}0>$ direction or in a $<10\bar{1}0>$ or otherwise in a direction intermediary therebetween is 0.02° to 20°;

the difference in off-axis angle at the crystal center, and at a location at a separation from the crystal center that is 80% of the distance to the substrate edge, is 0.01° to 0.3°; and the full width at half-maximum at the crystal is from 50 to 150 arcsec.

3. A semiconductor electronic circuit element characterized by being composed of device-constituting epitaxial layers formed on the III-V compound crystal according to claim 1.

4. A semiconductor electronic circuit element characterized by being composed of device-constituting epitaxial layers formed on the III-V compound crystal according to claim 2.

* * * * *